Figure 1:
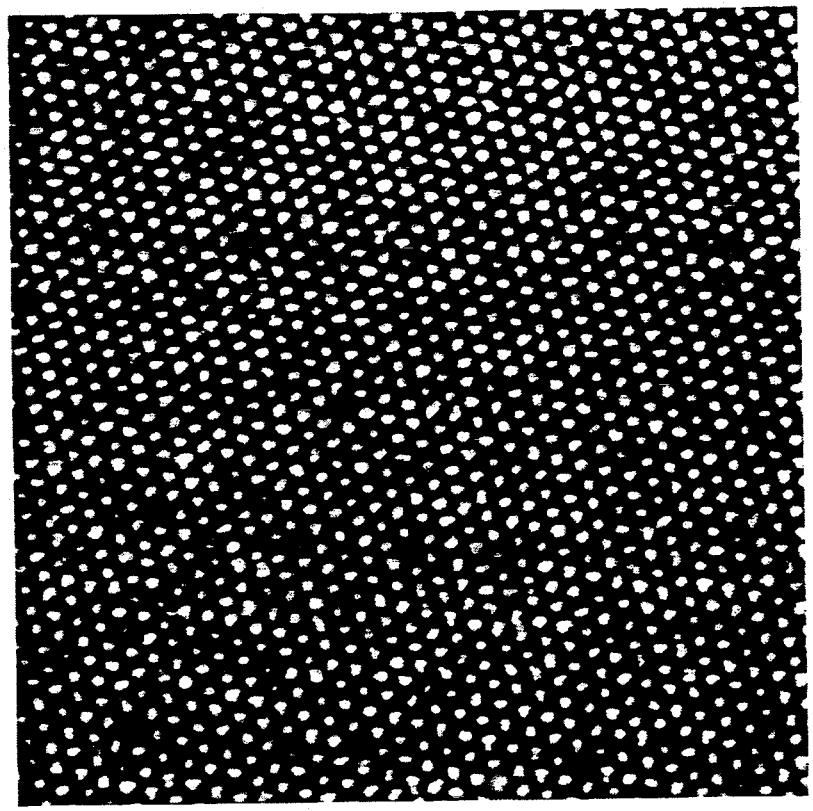

United States Patent [19]
Fuchs et al.

[11] Patent Number: 5,265,046
[45] Date of Patent: Nov. 23, 1993

[54] CHEMICAL LABELING OF THE SURFACES OF SOLIDS ON AN ATOMIC SCALE, AND THE STORAGE OF INFORMATION UNITS IN THE ATOMIC RANGE

[75] Inventors: Harald Fuchs, Carlsberg; Thomas Schimmel, Hof, both of Fed. Rep. of Germany

[73] Assignee: BASF Aktiengesellschaft, Ludwigshafen, Fed. Rep. of Germany

[21] Appl. No.: 814,633

[22] Filed: Dec. 30, 1991

[30] Foreign Application Priority Data

Jan. 7, 1991 [DE] Fed. Rep. of Germany ....... 4100254

[51] Int. Cl.$^5$ .............................. G11C 13/02
[52] U.S. Cl. .................................. 365/151; 365/153
[58] Field of Search ................. 365/151, 153, 189.01

[56] References Cited

U.S. PATENT DOCUMENTS 3,119,099  1/1964  Biernat ............................. 365/151

OTHER PUBLICATIONS

Lithography with the Scanning Tunneling Microscope, McCord et al., J. Vac. Sci. Technol. B4, 86–88 (1986).
Direct Writing of Submicron Metallic Features with a Scanning..., Silver et al. Appl. Phys. Lett. 51(4), Jul. 27, 1987.
Surface Modification in the Nanometer Range by the Scanning... Stauffer et al. J. Vac. Sci. Technol. A6(2), Mar. Apr. 1988.
Atomic-Scale Surface Modifications using a Tunnelling Microscope, Becker et al. Nature vol. 325, Jan. 29, 1987.
Direct writing in Si with a Scanning Tunneling Microscope, Van Loenen et al. Appl. Phys. Lett. 55(13), Sep. 25. 1989, 1312–1314.
Scanning Tunneling Microscope Instrumentation, Kuk et al., Rev. Sci. Instrum. 60(2), Feb. 1989 165–180.

*Primary Examiner*—Terrell W. Fears
*Attorney, Agent, or Firm*—Keil & Weinkauf

[57] ABSTRACT

A process useful for the reversible storage of information units involves the targeted, positionally selective and time-stable labeling of individual atomic positions or groups of such positions on the surface of a solid by chemical reaction with foreign atoms or molecules or by chemisorption, with the lateral atomic order of the surface in each case being retained, even on a local level.

10 Claims, 1 Drawing Sheet

CHEMICAL LABELING OF THE SURFACES OF SOLIDS ON AN ATOMIC SCALE, AND THE STORAGE OF INFORMATION UNITS IN THE ATOMIC RANGE

The present invention relates to a process for the targeted, positionally selective and time-stable labeling of individual atoms or groups of atoms on the surface of a solid by chemically reacting foreign atoms or molecules with the surface.

The storage of information, in particular image and data signals, currently takes place predominantly using magnetic or optical recording carriers. The information density which can be achieved using these is determined by the smallest information units which can be written and re-read by the process. In conventional magnetic storage media, these units are determined by the size of the magnetic domains (Weiβ domains), from a mechanical point of view by the head gap of the read/write heads used and by the distance of the read/write unit from the actual information carrier. In information carriers where the stored information is produced by a change in optical properties, the limit is the wavelength of the light used. The smallest information units here can thus not be smaller than about half the wavelength of the light. An increase in storage density in optical recording carriers of this type has in the meantime also been achieved through optical near-field microscopy, where the optical read unit is only a few nanometers above the information-carrying surface. The best information densities achieved here at present are in the order of about 20 nm.

A further increase in the information density is only possible by using near-field techniques with a resolution in the subnanometer range. Suitable methods for this purpose are scanning probe techniques, including the scanning tunneling microscope and the atomic force microscope. These methods allow imaging of surfaces on an atomic scale. It has therefore been proposed to produce information storage media having the highest possible density, namely in the range of the individual atoms or molecules. Success in developing these media would result in information densities in the terabyte/cm$^2$ range.

A number of proposals have been made for storing information in the nanometer range on inorganic or organic surfaces, including M. A. McCord et al., J. Vac. Sci. Technol. B4, (1986), 86-88, R. M. Silver et al., Appl. Phys. Lett. 51 (1987), 247-249 and U. Staufer et al., J. Vac. Sci. Technol. A6 (1988), 537-539. The deposition of individual atoms has also been reported (R. S. Becker et al., Nature 325 (1987), 415-421).

However, all the proposals disclosed hitherto for the provision of maximum-resolution information storage media which also have, in particular, long-term stability are unsatisfactory. Whereas organic storage media, so far, are incapable of producing line widths of <10 nm, inorganic systems, which can reproduce structures down to about 3 nm, are unable to retain them in a stable manner for any length of time, i.e. for from minutes to hours. In the case of the long-term stable structures in silicon which have previously been disclosed (Van Loenen et al., Appl. Phys. Lett. 55 (1989), 1312-1314), by contrast, the atomic structure is destroyed, i.e. the atomic order is lost. A process of this type is therefore only suitable for producing non-erasable storage media.

It is therefore an object of the present invention to provide a process which allows the targeted, time-stable labeling of positions on the surface of a solid on an atomic scale, i.e. which facilitates the time-stable storage of information, without locally destroying the solid lattice or causing a significant change in the position of the lattice sites parallel to the surface.

We have found that this object is achieved by a process for the targeted, positionally selective and time-stable labeling of individual atomic positions or groups of such positions on the surface of a solid by chemically reacting foreign atoms or molecules with the surface, if the reaction is carried out on an atomic scale in a targeted manner using a surface-sensitive scanning probe, with the proviso that the atomic lattice positions of the upper atomic layer parallel to the surface are not significantly changed or that atoms or molecules are not removed from previously occupied lattice positions.

The process according to the invention is advantageously carried out by effecting the local chemical reaction of the surface with the foreign atoms or foreign molecules by applying an electrical or magnetic field for a limited time and over a limited area.

The process according to the invention for the time-stable labeling of individual atoms or groups of atoms can be particularly advantageously employed for storing information units. This provides a way of storing information in the atomic range and thus achieving a correspondingly high information density.

However, the process according to the invention is not limited to information storage, but can also be used for erasing stored information. This is because the chemical bonds between the foreign atoms or foreign molecules and the surface can be broken again, and the original state thus restored, by supply of energy for example in the form of thermal energy or electromagnetic radiation (for example laser treatment of the entire surface or of points), or by chemical treatment of the surface, since the lattice is not destroyed, even locally, during the labeling process.

The process according to the invention is carried out in the presence of the coreactant in a sufficient concentration, for example as a reactive atmosphere or in the form of foreign atoms or molecules adsorbed onto the surface to be modified. Particularly suitable surfaces have proven to be semiconducting layered materials, in particular tungsten diselenide (WSe$_2$). The atomic labeling is carried out in the surface of a layer of this type using the near-field technique, e.g. by means of a needle-shaped electrode of a surface-sensitive scanning probe, for example a scanning tunneling microscope or a scanning atomic force microscope, by applying a short-duration electrical or magnetic field. Since the area of maximum electric field of a scanning probe of this type is preferably from 10 nm to 0.1 nm on the surface of the semiconducting layered material, individual atoms or groups of atoms can be targeted. The external field applied can initiate a local chemical reaction on an atomic scale in a targeted manner between the surface of the solid and the foreign atoms or molecules. The essential feature here is that the process according to the invention allows this reaction to take place with the surface without the order of the lattice being locally destroyed in such a manner that, for example, atoms or molecules are removed from lattice positions; it is even possible to avoid a change in the positions of the lattice sites parallel to the surface.

The near-field technique used for writing the information can be conventional scanning tunneling microscopy or atomic force microscopy processes. The arrangement of these near-field techniques for characterizing surfaces is known and has been described (Y. Kuk et al., Rev. Sci. Instrum. 60 (2) (1989), 165–180).

The process according to the invention is described in illustrative terms below:

The surface of a tungsten diselenide sample was first imaged at atomic resolution using a scanning tunneling microscope. During the scan of the tunneling tip over the sample, voltage pulses having an amplitude of from 0.7 to 0.9 volts were then applied, superimposed on the tunneling voltage, between the tunneling tip and the sample by means of a pulse generator. Subsequent scanning of the sample gives structures on the surface on which labeling of atomic positions can be clearly seen; the labeled atoms differ from their unlabeled neighbors by an increase in their effective height, which is evident, for example, as in FIG. 2, from the greater brightness of the labeled atomic positions compared with their unlabeled neighbors.

Figure 2:
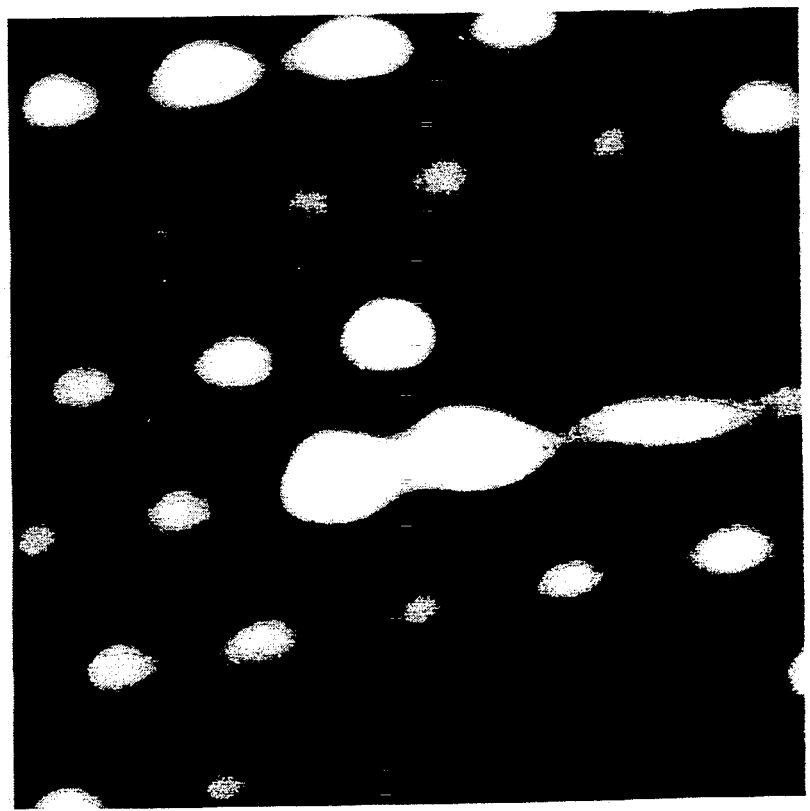

The labeling process is described in illustrative terms with reference to FIGS. 1 and 2. Tungsten diselenide was used as the solid and air as the reaction medium for the experiment. In order to ensure better adsorption of the coreactant at the surface, the experiment was carried out not using a freshly prepared sample, but instead using a sample whose surface had been exposed to normal laboratory air for several weeks at room temperature before the experiment. FIG. 1 shows the STM image of a grown $WSe_2$ surface in the unmodified state, and FIG. 2 shows the same surface immediately after application of voltage pulses of about 1.5 V. The individual points in the photographs are tungsten atoms on the $WSe_2$ surface (separation between adjacent atoms = 0.33 nm). Groups comprising three atoms were targeted here, with the relative position corresponding exactly to the positions of the tunneling tip at the time of the pulse. In this way, patterns can be written on the sample; each voltage pulse labels, in a defined position, atoms which, after the modification, are still in their original lateral position, but whose charge density has been modified (increased in the example in FIG. 2) by the chemical bond formed with the coreactant.

There was no problem in writing more than 100 structures using the same tip and subsequently imaging these at atomic resolution. There were normally no variations in imaging quality of the sample tip as a consequence of the pulsing. Both writing and reading can be carried out under normal conditions, i.e., in particular, without using an inert gas, vacuum or low temperatures.

In order to test the stability of the labels with time, certain arrangements of labeled points, for example in triangles or as parallelograms, were written specifically, the resultant structures were imaged, and their relative positions to one another were recorded; the structures were found again after two days in unchanged form and in the same arrangement. In particular, it was also possible to show that they are stable in air.

For application as an information store, it is essential that the reading operation does not modify the stored information. To this end, both large and small structures (FIG. 2) on various tungsten diselenide samples were scanned using the STM over several hours, during which time they were imaged up to 500 times. In no case was a modification due to the imaging process (=reading process when used as a data carrier) observed.

Structures on tungsten diselenide surfaces are most easily erased by heating the sample surface at about 600° C. for about 40 minutes. This operation causes surfaces covered with structures, but still atomically ordered, to become flat and structureless again on an atomic scale.

For use as an information store, the functions reading, writing and erasing have thus been demonstrated by means of a positionally selective (on an atomic scale) chemical process and the processes used to achieve them have been indicated (nanochemical information store); for the structures generated in FIG. 2, a data density of about 10 terabytes/$cm^2$ is produced, exceeding the storage density of magnetic hard disks or magnetooptical disks by several orders of magnitude.

We claim:

1. A process for the targeted, positionally selective and time-stable labeling of individual atomic positions or groups of such positions on the surface of a solid by chemically reacting foreign atoms or molecules with the surface, which comprises carrying out the reaction on an atomic scale in a targeted manner using a surface-sensitive scanning probe, with the proviso that the atomic lattice positions of the upper atomic layer parallel to the surface are not changed and that atoms or molecules are not removed from previously occupied lattice positions.

2. A process as claimed in claim 1, wherein the surface-sensitive probe employed is a scanning tunneling microscope (STM).

3. A process as claimed in claim 1, wherein the surface-sensitive probe employed is a scanning atomic force microscope (SAFM).

4. A process as claimed in claim 1, wherein the local chemical reaction is effected by applying an electrical or magnetic field for a limited time and over a limited area.

5. A process as claimed in claim 4, wherein the electrical field applied for a limited time and over a limited area is produced by applying a voltage pulse between the tip of an STM or SAFM and the surface in question.

6. A process as claimed in claim 4, wherein the chemical reaction is effected by applying an electrical field for a limited time and over a limited area whilst simultaneously exposing the surface to light.

7. A process as claimed in claim 1, wherein the surface employed is a semiconducting layered material.

8. A process as claimed in claim 1, wherein the chemical reaction of the surface takes place with atoms and molecules of a gas surrounding the surface.

9. A process as claimed in claim 1, wherein a chemical reaction takes place with atoms or molecules adsorbed at the surface.

10. A process for erasing labels obtained as claimed in claim 1, by supply of thermal energy, exposure to electromagnetic radiation or chemical treatment of the surface.

* * * * *